(12) United States Patent
Darges

(10) Patent No.: US 8,830,008 B2
(45) Date of Patent: Sep. 9, 2014

(54) GENERATOR OF A MODULATED RADIOFREQUENCY SIGNAL, METHOD FOR CALIBRATING THE GENERATOR, AND MAGNETIC RESONANCE IMAGING SYSTEM

(75) Inventor: Bernard Darges, Thonon les Bains (FR)

(73) Assignee: Thales, Neuilly sur Seine (FR)

( * ) Notice: Subject to any disclaimer, the term of this patent is extended or adjusted under 35 U.S.C. 154(b) by 129 days.

(21) Appl. No.: 13/381,363

(22) PCT Filed: Jun. 30, 2010

(86) PCT No.: PCT/EP2010/059306
§ 371 (c)(1),
(2), (4) Date: Dec. 28, 2011

(87) PCT Pub. No.: WO2011/000882
PCT Pub. Date: Jan. 6, 2011

(65) Prior Publication Data
US 2012/0105166 A1    May 3, 2012

(30) Foreign Application Priority Data

Jun. 30, 2009 (FR) ..................................... 09 03192

(51) Int. Cl.
*H03C 3/38* (2006.01)
*H03F 1/02* (2006.01)
*H03F 3/217* (2006.01)
*G01R 33/565* (2006.01)
*G01R 33/58* (2006.01)
*G01R 33/36* (2006.01)

(52) U.S. Cl.
CPC ............ *H03F 1/0294* (2013.01); *G01R 33/583* (2013.01); *G01R 33/3614* (2013.01); *H03F 1/0205* (2013.01); *G01R 33/3607* (2013.01); *H03F 3/2176* (2013.01); *G01R 33/5659* (2013.01); *G01R 33/3678* (2013.01)
USPC ................ 332/145; 330/53; 330/84; 330/149

(58) Field of Classification Search
USPC ............................... 332/145; 330/124 R, 149
See application file for complete search history.

(56) References Cited

U.S. PATENT DOCUMENTS 4,656,434 A * 4/1987 Selin ............................... 330/84
5,901,346 A    5/1999 Stengel et al.
(Continued)

FOREIGN PATENT DOCUMENTS

WO    00/36800 A2    6/2000
WO    01/91282 A2    11/2001

*Primary Examiner* — Joseph Chang
*Assistant Examiner* — Jeffrey Shin
(74) *Attorney, Agent, or Firm* — Baker Hostetler LLP

(57) ABSTRACT

A generator of a high-power modulated signal, a method for calibrating the generator, and a magnetic resonance imaging system. The generator includes means for generating a sinewave signal phase-shifted by a first variable value relative to a phase reference and a sinewave signal phase-shifted by a given fixed value added to a second variable value relative to the phase reference, the second variable value opposite to the first variable value relative to the phase reference, the variable values representative of the modulation of the radiofrequency signal, the two sinewave signals being of constant amplitude, two amplifiers each amplifying one of the sinewave signals in a congested regime, and a fixed phase shifter with a value equal to the given value of the means to generate the two sinewave signals, the fixed phase shifter coupling the signals originating from the two amplifiers to deliver the modulated radiofrequency signal.

7 Claims, 5 Drawing Sheets

(56) References Cited

U.S. PATENT DOCUMENTS

2005/0018787 A1    1/2005    Saed
2007/0159243 A1    7/2007    Albrecht
2010/0295610 A1*    11/2010    Svechtarov ............... 330/124 R \* cited by examiner

GENERATOR OF A MODULATED RADIOFREQUENCY SIGNAL, METHOD FOR CALIBRATING THE GENERATOR, AND MAGNETIC RESONANCE IMAGING SYSTEM

CROSS-REFERENCE TO RELATED APPLICATIONS

This application is a National Stage of International patent application PCT/EP2010/059306, filed on Jun. 30, 2010, which claims priority to foreign French patent application No. FR 09 03192, filed on Jun. 30, 2009, the disclosures of each of which are incorporated by reference in their entireties.

FIELD OF THE DISCLOSED SUBJECT MATTER

The invention relates to a generator of a high-power modulated signal, a method for calibrating the generator and a magnetic resonance imaging system. The invention is of particular use in magnetic resonance imaging (MRI). It involves a medical imaging technique based on nuclear magnetic resonance making it possible to produce views in two or three dimensions of a portion of the body and notably of the brain. A modulated electromagnetic wave of high frequency, for example around 127.7 MHz at a power of between 1 and 30 kW or even more, is applied to the portion of the body to be analyzed and the signal retransmitted by certain atoms such as hydrogen for example is measured. This technique makes it possible to determine the chemical composition and therefore the nature of the biological tissues of the imaged volume.

BACKGROUND

Generating radiofrequency signals necessary for this imaging technique requires linearity characteristics that are strict in amplitude and in phase. It has to be possible to adjust the output power while complying with these linearity criteria. An example of a linearity criterion to be complied with is to maintain a differential gain between the output and the input of: +/−0.15 dB and a differential phase of: +/−1.25°.

Currently the amplifiers used for magnetic resonance imaging applications are linear amplifiers operating in class AB. The use of such amplifiers all the same requires the putting in place of a linearity correction of the "pre-distortion" type. For such a correction to be used, the class AB amplifiers must work with compressions of less than one dB. This type of correction is used in the RF band, which may pose many problems such as, for example, the temperature stability of the power components and the variation of the gain as a function of the temperature. The technology of the electronic components used may also be a blocking factor. The use of MOS and LDMOS technology shows a phase rotation in advance of the compression unlike the bipolar technology currently abandoned in the frequency bands used in magnetic resonance imaging. Note that the technology called MOS is derived from "metal-oxide semiconductor" for transistors of which the gate is insulated from the drain source connection by an oxide layer. The LDMOS "laterally diffused metal-oxide semiconductor" technology is used for high-frequency power transistors and is achieved by the use of a particular mode of diffusing doping elements on the substrate.

SUMMARY

The object of the invention is to alleviate all or some of the problems cited above and to substantially reduce the cost of the generators currently used by proposing to use amplifiers working beyond a compression dB.

In order to create a linear signal that is useful for the MRI application, the invention proposes dividing the power radiofrequency amplification P into two half-power blocks P/2. The modulation of the radiofrequency signal is obtained by phase control of each block. The use of two fixed phase shifters of the same phase shift allows, for the first, the generation of RF control signals of each power block and, for the second, the summing of the power signals originating from each block.

In other words, the subject of the invention is a generator of a modulated radiofrequency signal characterized in that it comprises:
  means for generating a sinewave signal that is phase-shifted by a first variable value relative to a phase reference and a sinewave signal phase-shifted by a given fixed nonzero value added to a second variable value relative to the phase reference; the second variable value being opposite to the first variable value relative to the phase reference, the variable values being representative of the modulation of the radiofrequency signal, the two sinewave signals being of constant amplitude,
  two amplifiers each amplifying one of the sinewave signals in a congested regime,
  a fixed phase shifter with a value equal to the given nonzero value of the means in order to generate the two sinewave signals, the fixed phase shifter coupling the signals originating from the two amplifiers in order to deliver the modulated radiofrequency signal.

A further subject of the invention is a method for calibrating a generator according to the invention, characterized in that it consists in correcting the amplitude and the phase of the two sinewave signals in order to obtain a ratio of amplitude and phase linearity of the modulated radiofrequency signal as a function of a modulation command, the linearity ratio being within a given tolerance range.

A further subject of the invention is a magnetic resonance imaging system comprising a generator according to the invention.

In practice, such a generator can generate harmonic frequencies of the carrier frequency. It is necessary to filter these harmonics at the output of the generator. In the context of the invention, it is possible to choose any nonzero value for the fixed phase-shift value. But advantageously, a value of 90° is chosen. This phase shifter is also called a quadrature phase shifter. Specifically, this type of phase shifter markedly reduces the production of uneven harmonics. It is estimated that the production of uneven harmonics in a 180° phase shifter is of the order of −20 dB while in a quadrature phase shifter the rate of uneven harmonics is of the order of −35 dB. Output filtering is then made easier. Moreover, by using class B amplifiers, currently called amplifiers with a "push" structure, the generation of harmonics of even order is greatly reduced. The association of a quadrature phase shifter and push-structure amplifiers in the context of the invention reduces the size of the output filters.

BRIEF DESCRIPTION OF THE DRAWINGS

The invention will be better understood and other advantages will appear on reading the detailed description of an embodiment given as an example, the description illustrated by the appended drawing in which.

For the purposes of clarity, the same elements will bear the same references in the various figures.

DETAILED DESCRIPTION

Figure 1:
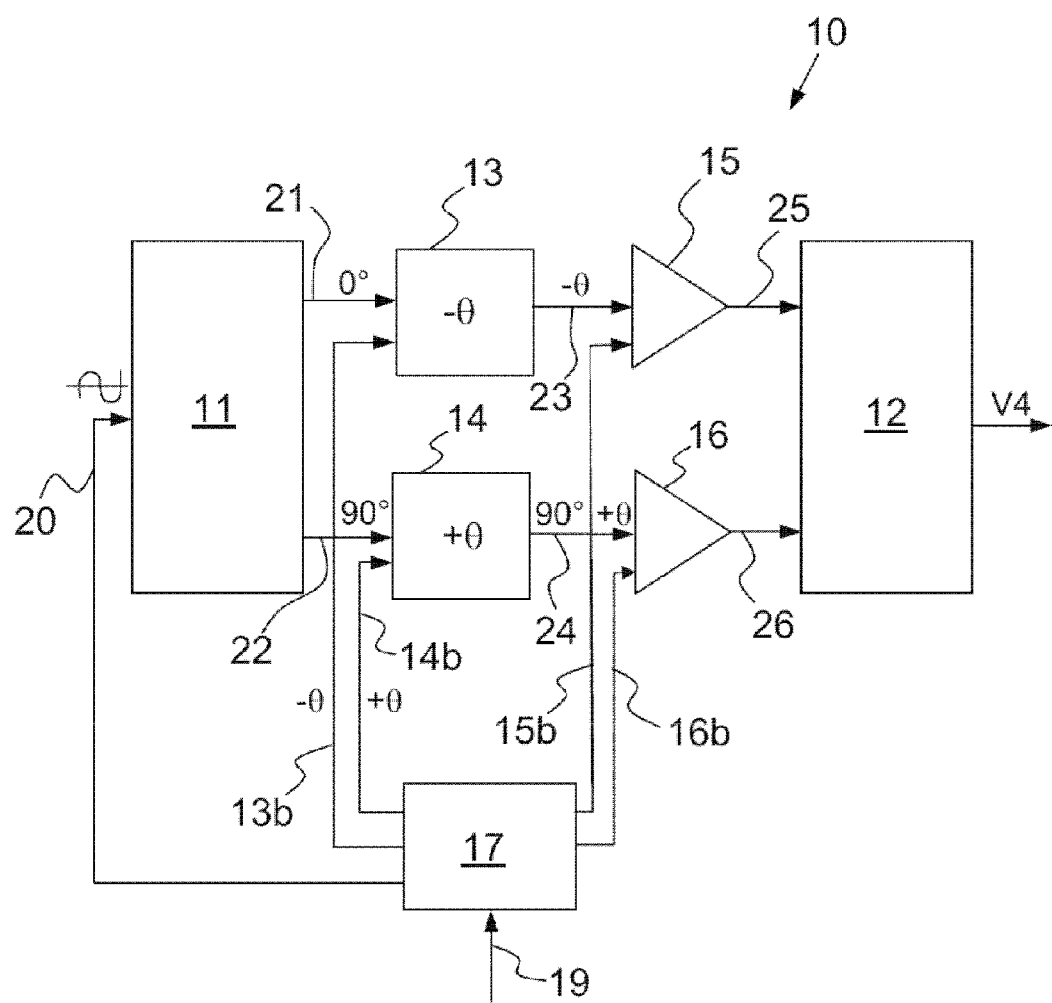
FIG. 1 represents schematically various components of a first variant of a generator according to the invention.

FIG. 1 represents an example of a generator 10 designed to be used in a magnetic resonance imaging application. It is clearly understood that the invention can be used in any other field for which the criteria of amplitude and phase linearity are strict. The generator makes it possible to deliver a modulated radiofrequency signal on a carrier of fixed frequency, for example 127.7 MHz as currently used in magnetic resonance imaging. Other frequencies are of course possible without departing from the context of the invention.

The generator 10 comprises two quadrature phase shifters 11 and 12, two controlled phase shifters 13 and 14 and two amplifiers 15 and 16.

The first quadrature phase shifter 11 receives on an input 20 a sinewave signal that can be phase-modulated or frequency-modulated. This signal forms a carrier of constant amplitude. The quadrature phase shifter 11 comprises two outputs 21 and 22 on which are found the non-phase-shifted sinewave signal on the output 21 and the sinewave signal phase-shifted by 90° C. on the output 22. The signals present on the two outputs 21 and 22 have the same amplitude. This amplitude is reduced by 3 dB relative to the amplitude of the input 20.

The output 21 forms the input of the first controlled phase shifter 13 and the output 22 forms the input of the second controlled phase shifter 14. Controls 13*b* and 14*b* of the two phase shifters respectively 13 and 14 are in opposition and are marked θ and −θ. More precisely, the phase shifter 13 shifts the phase of the signal that it receives through an angle θ and the phase shifter 14 shifts the phase of the signal that it receives through an angle −θ. The angle θ is representative of the modulation index to be applied to the signal. The phase shifter 13 comprises an output 23 forming the input of the amplifier 15 and the phase shifter 14 comprises an output 24 forming the input of the amplifier 16. It is possible to apply amplifiers 15 and 16 used close to their saturation point, as for example class B, D or E amplifiers, even though this generates a compression of the signals greater than the linearity required at the output of the generator 10. In practice, it is possible to use amplifiers of which the compression in high power markedly exceeds 1 dB. Each amplifier 15 and 16 comprises an output, respectively 25 and 26, forming two inputs of the quadrature phase shifter 12 which provides the coupling of the signals originating from the amplifiers 15 and 16 in order to deliver to an output 27 the radiofrequency signal that is amplitude-modulated as a function of the phase θ.

Figure 2:
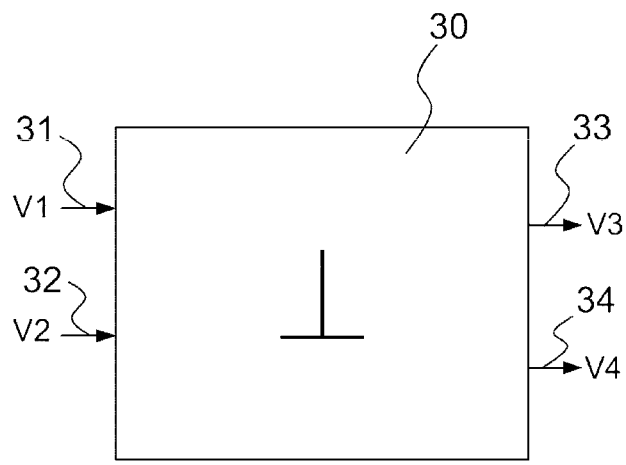
FIGS. 2 to 6 make it easier to understand the operating principle of the generator of FIG. 1.

FIGS. 2 to 6 give a better understanding of the operating principle of the generator of FIG. 1. FIG. 2 represents a quadrature phase shifter 30 comprising two inputs 31 and 32 and two outputs 33 and 34. Radiofrequency signals V1 and V2 are applied respectively to the inputs V1 and V2. The phase shifter 30 delivers a signal V3 to the output 33 and a signal V4 to the output 34.

In general, the equations (1) and (2) describe a sinewave signal of amplitude $v_1$ and of phase $\Phi 1$ for the signal V1 and of amplitude $v_2$ and of phase $\Phi 2$ for the signal V2

$$V1 = \frac{v_1}{\sqrt{2}} e^{j\phi_1} \qquad (1)$$

$$V2 = \frac{v_2}{\sqrt{2}} e^{j\phi_2} \qquad (2)$$

At the phase-shifter output 30, the signals V3 and V4 are given by the equations (3) and (4)

$$V3 = \frac{v_1}{\sqrt{2}} e^{j(\phi_1 - \frac{\pi}{2})} + \frac{v_2}{\sqrt{2}} e^{j\phi_2} \qquad (3)$$

$$V4 = \frac{v_1}{\sqrt{2}} e^{j(\phi_1)} + \frac{v_2}{\sqrt{2}} e^{j(\phi_2 - \frac{\pi}{2})} \qquad (4)$$

To simplify the expressions of the equations (3) and (4), let: $\Phi 1=0$ and $\Phi 2=\Phi 1+\phi$. This then gives $$V3 = \frac{v_1}{\sqrt{2}} e^{j(-\frac{\pi}{2})} + \frac{v_2}{\sqrt{2}} e^{j\varphi} \qquad (5)$$

$$V4 = \frac{v_1}{\sqrt{2}} e^{j0} + \frac{v_2}{\sqrt{2}} e^{j(\varphi - \frac{\pi}{2})} \qquad (6)$$

In the particular case in which $$\varphi = \frac{\pi}{2}$$

and $v_1=v_2$, this gives:

$$V3 = \frac{v_1}{\sqrt{2}} e^{j(-\frac{\pi}{2})} + \frac{v_2}{\sqrt{2}} e^{j(\frac{\pi}{2})} \qquad (7)$$

Therefore:

$$V3 = 0 \qquad (8)$$

and $$V4 = \frac{v_1}{\sqrt{2}} e^{j0} + \frac{v_2}{\sqrt{2}} e^{j(\frac{\pi}{2} - \frac{\pi}{2})} \qquad (9)$$

$$V4 = \left(\frac{v_1 + v_2}{\sqrt{2}}\right) e^{j0} \qquad (10)$$

$$V4 = (V1 + V2) e^{j0} \qquad (11)$$

Figure 3:
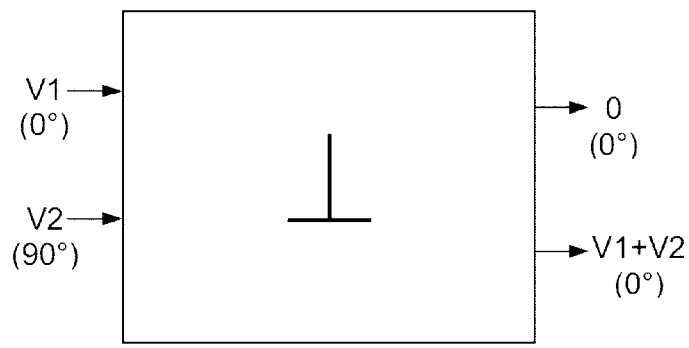

This case represents the phase shifter 12 when θ=0 and is represented in FIG. 3.

On the other hand, when θ is different from 0, it is considered that $\Phi 1=0$ and $$\phi 2 = \phi 1 + \frac{\pi}{2} + \theta.$$

This then gives $$V3 = \frac{v_1}{\sqrt{2}} e^{j(-\frac{\pi}{2})} + \frac{v_2}{\sqrt{2}} e^{j(\theta + \frac{\pi}{2})} \qquad (12)$$

-continued $$V4 = \frac{v_1}{\sqrt{2}} e^{j0} + \frac{v_2}{\sqrt{2}} e^{j\theta} \quad (13)$$

Considering that $v_1 = v_2$, it is possible to express V4 in polar form:

$$V4 = (V1+V2)(\cos(0)+\cos(\theta)+j(\sin(0)+\sin(\theta))) \quad (14)$$

$$V4 = (V1+V2)(1+\cos(\theta)+j\sin(\theta)) \quad (15)$$

In other words, the modulus of V4 can be expressed in the form:

$$(v_1+v_2)\sqrt{(1+\cos\theta)^2 + \sin^2\theta} = (v_1+v_2)\sqrt{2+2\cos\theta} \quad (16)$$

The phase of V4 can be expressed in the form:

$$\frac{\sin\theta}{1+\cos\theta} \quad (17)$$

Figure 4:
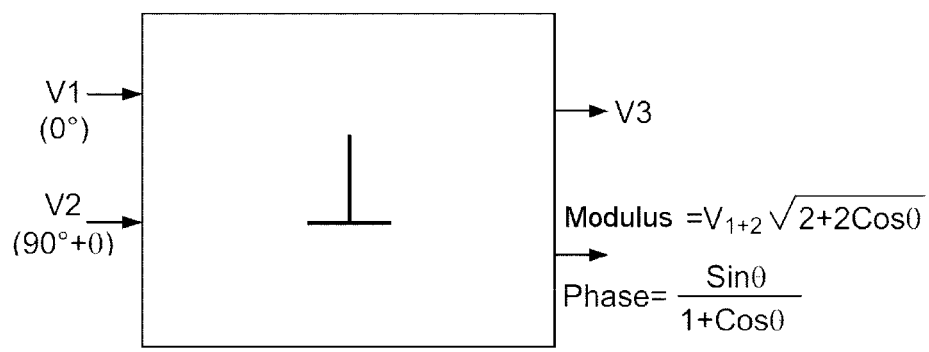

The modulus and the phase of V4 are shown in FIG. 4. For the phase shifter 12, all that is of interest is the output 34 where the signal V4 is present. In order to obtain a constant phase for V4, a phase $-\theta$ is applied to the input V1 while maintaining a phase $\theta + \pi/2$ on the input V2. In other words:

$$\phi 1 = -\theta$$

$$\phi 2 = \phi 1 + \frac{\pi}{2} + \theta.$$

Still considering that V1 and V2 have the same amplitude, the equation (4) becomes:

$$V4 = \frac{v_1}{\sqrt{2}} e^{-j\theta} + \frac{v_2}{\sqrt{2}} e^{j(\theta + \frac{\pi}{2} - \frac{\pi}{2})} \quad (18)$$

$$V4 = \frac{v_1}{\sqrt{2}} e^{-j\theta} + \frac{v_2}{\sqrt{2}} e^{j\theta} \quad (19)$$

$$V4 = \frac{v_1 + v_2}{2\sqrt{2}} (e^{-j\theta} + e^{j\theta}) \quad (20)$$

$$V4 = \frac{v_1 + v_2}{2\sqrt{2}} (\cos\theta - j\sin\theta + \cos\theta + j\sin\theta) \quad (21)$$

$$V4 = \frac{v_1 + v_2}{\sqrt{2}} \cos\theta \quad (22)$$

Figure 5:
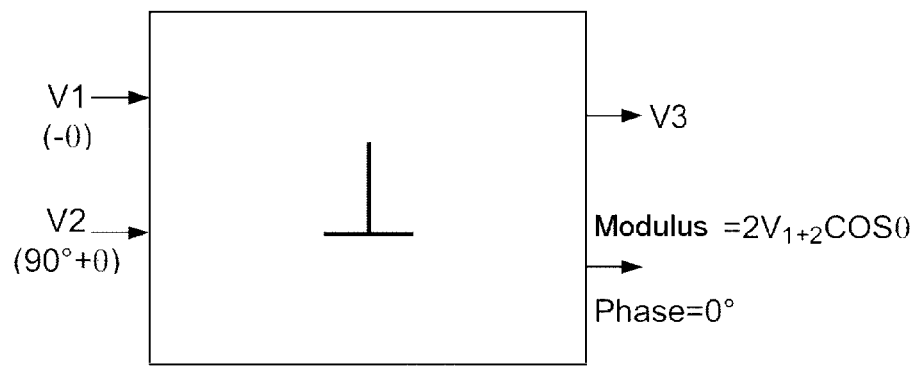

By calling $V_{1+2} = V1 = V2$, we obtain: $V4 = 2V_{1+2} \cos\theta$, which is shown in FIG. 5.

Figure 6:
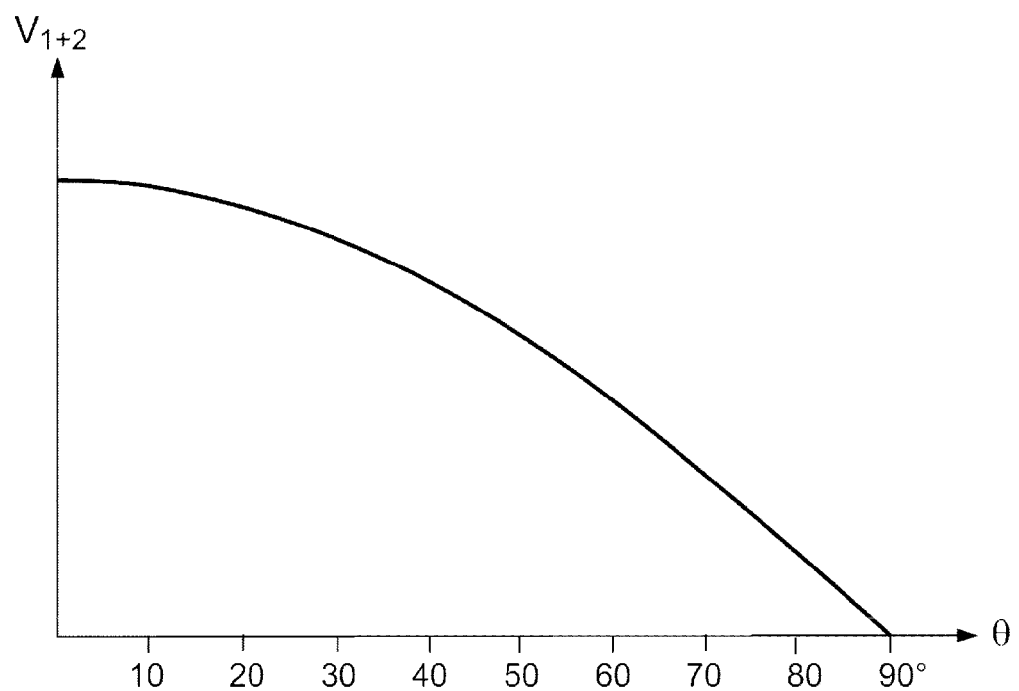

It is found that the phase of the signal 34 is still zero and that its amplitude depends only on the angle $\theta$. In other words, the radiofrequency signal originating from the generator in amplitude modulation as a function of a control produced by the angle $\theta$. FIG. 6 shows the evolution of the amplitude of the signal of output V4 as a function of the angle $\theta$ when the latter changes between 0° and 90°. Based on a voltage control proportional to the amplitude to be obtained for the modulation of the radiofrequency signal, it is possible to use a simple linearizer supplying the reciprocal function of the transfer function of the phase shifter 12. In the example in question in which the phase shifter 12 is a quadrature phase shifter, the reciprocal function is of the "inverse cosine" type.

The generator may also comprise a computer 17 making it possible to control the phase shifters 13 and 14 with the angles $+\theta$ and $-\theta$. The computer 17 may also generate the pure sinewave signal applied to the input 20. The computer 17 determines the angle $\theta$ based on a control 19 proportional to the amplitude to be obtained for the modulation of the radiofrequency signal. The control 19 is for example a voltage control. Advantageously, the generator comprises means for turning off the two amplifiers 15 and 16. This turning off is particularly useful in magnetic resonance imaging. Specifically, in this application, the radiofrequency signal originating from the generator is pulsed. Outside the periods in which the radiofrequency signal has a nonzero amplitude, it is important to prevent any noise that might be present on the outputs 25 and 26 even when the value of $\theta$ is 90°. This turning off is for example obtained by controls 15b and 16b of the amplifiers 15 and 16, controls originating from the computer 17.

Figure 7:
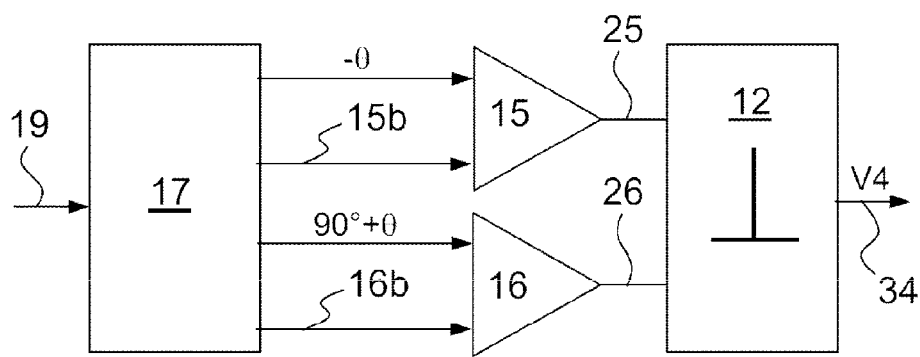
FIG. 7 shows another variant embodiment of a generator according to the invention.

FIG. 7 represents a variant embodiment of a generator according to the invention. In this variant, the first phase shifter 11 and the controlled phase-shifters 13 and 14 are dispensed with. The computer 17 supplies directly the sinewave signal phase-shifted by the variable value $-\theta$ and the sinewave signal phase-shifted by the variable value $90°+\theta$. These signals are of low amplitude and can therefore be delivered by the computer 17 based on the control 19 (digital frame for example). The computer 17 also generates the turning-off controls 15b and 16b.

Figure 8:
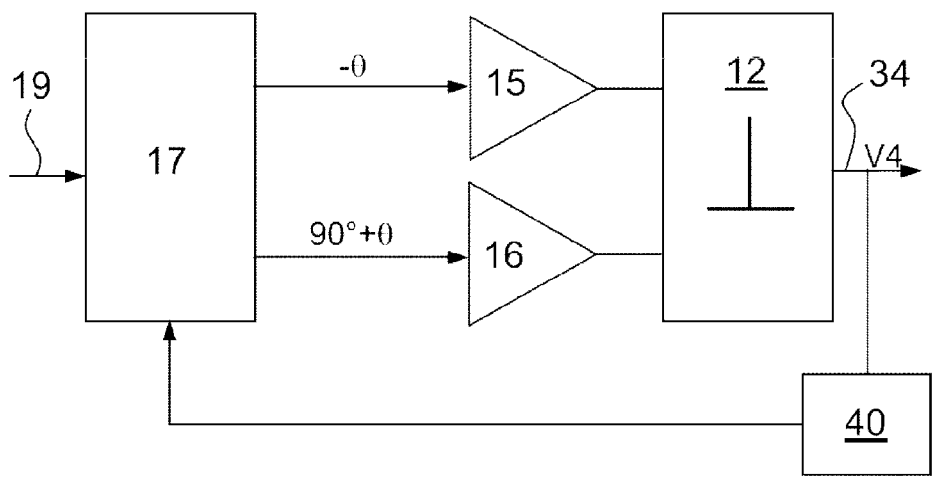
FIG. 8 makes it easier to understand a method for calibrating a generator according to the invention.

FIG. 8 makes it easier to understand a method for calibrating a generator according to the invention. To calibrate the generator, a measurement probe 40 is connected to the output 34 of the phase shifter 12. The probe 40 makes it possible to measure the amplitude and the phase of the radiofrequency signal that is present on the output 34. The probe 40 transmits the information that it measures to the computer 17. FIG. 8 supplements the generator shown in FIG. 7. It is clear that this calibration method is also adapted to the generator of FIG. 1.

During calibration, a series of controls 19 is applied to the computer 17, said controls being distributed over an amplitude range in which the generator must be able to operate. The distribution over the range is carried out in n evenly-spaced echelons. For each echelon, the value of the control 19 is compared with the response delivered by the probe 40. It is also possible to define a control 19 in the form of a ramp for improving the linearity of the calibration.

Initially, for each control echelon, a coefficient $C_n$ is determined for correction of the amplitude of each sinewave signal present on the outputs 21 and 22 in order to obtain an amplitude of the radiofrequency signal V4 that is proportional to the control 19 with a rate of linearity less than a given tolerance.

Secondly, for each control echelon, a coefficient $\phi$ for correcting the phase of each sinewave signal present on the outputs 21 and 22 is determined in order to obtain a zero phase of the radiofrequency signal V4 with a rate of linearity below a given tolerance.

Figure 9:
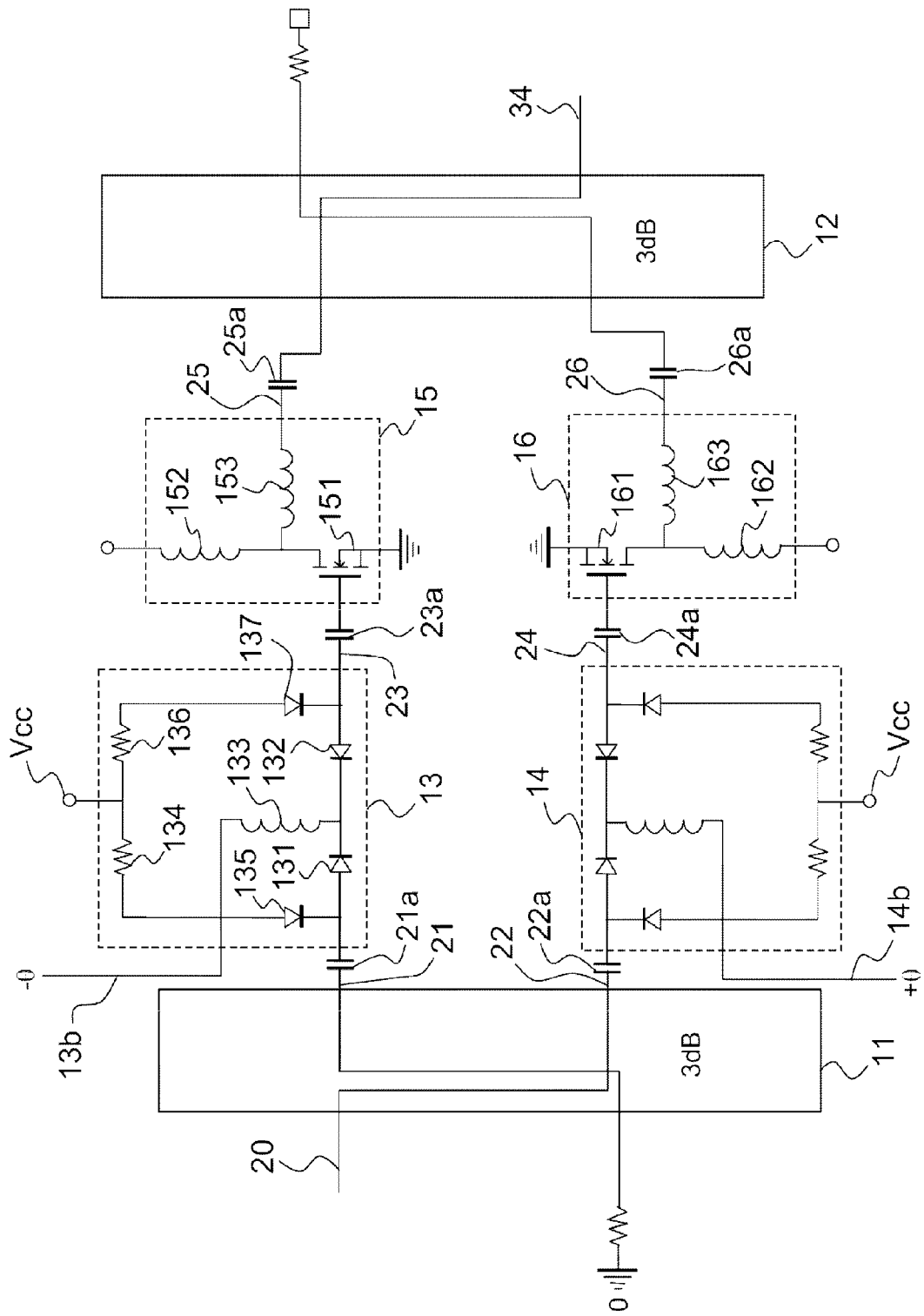
FIG. 9 represents schematically an exemplary embodiment of the generator 10 of FIG. 1.

FIG. 9 represents schematically an exemplary embodiment of the generator 10 of FIG. 1.

This shows the two quadrature phase shifters 11 and 12 that can be made by means of transmission lines of a length equal to a quarter of the wavelength of the sinewave signal present on the input 20. It is possible to reduce the physical dimensions of the quadrature phase shifters 11 and 12 by using a substrate of high permittivity such as for example a ceramic substrate or else by folding the transmission lines.

In FIG. 9, the controlled phase shifters 13 and 14 may for example use diodes comprising a non-doped zone, called an intrinsic zone, inserted between doped zones, one positive and the other negative. Hereinafter, this type of diode will be called a PIN ("Positive Intrinsic Negative") diode. PIN diodes are used for their variation of capacitance as a function of the bias that is applied thereto. More precisely, the phase shifter 13 comprises two diodes 131 and 132 mounted head-to-toe in series between the input 22 and the output 23. It is possible to vary the capacitance of the two diodes 131 and 132 by applying in their common cathode the control 13b in the form of a bias. A stopping self-inductor 133 may be placed between the control 13b and the cathodes of diodes 131 and 132 in order to prevent the radiofrequency signal from interfering with the computer 17. The phase shifter 13 is moreover powered by a DC voltage marked Vcc. This voltage is connected on the one hand to the input 21 by means of a resistor 134 and a diode 135 connected in series. The cathode of the diode 135 is connected to the anode of the diode 131. The voltage Vcc is connected on the other hand to the output 23 by means of a resistor 136 and a diode 137 connected in series. The cathode of the diode 137 is connected to the anode of the diode 132.

The capacitance of the diodes 135 and 137 does not vary under the effect of the control 13b. The phase shifting is provided by the combination of subassemblies of the RC type, on the one hand the resistor 134 associated with the diodes 131 and 135 and on the other hand the resistor 136 associated with the diodes 132 and 137.

The phase shifter 14 is similar to the phase shifter 13. The controls 13b and 14b provide, for example with one and the same control voltage, a mean phase shift of +45° for the phase shifter 14 and +45° for the phase shifter 13. In order to create the radiofrequency signal or other types desired at the output 34 of the phase shifter 12, the control voltages 13b and 14b are made to vary in the opposite direction around a mean voltage Vcc/2 (the voltage providing the relative phase shifting between each channel). As an example, for a voltage Vcc/2 applied to the controls 13b and 14b, the output voltage of the phase shifter 12 will be maximal. For a voltage (Vcc/2−Δu) on 13b and (Vcc/2+Δu) on 14b, the output voltage 34 will be reduced in amplitude. The voltage difference between the two channels 2Δu corresponds to the relative difference in phase of 2θ.

The amplifiers 15 and 16 are, in the example shown in FIG. 9, class E amplifiers. They each comprise a transistor with an insulated gate, 151 for the amplifier 15 and 161 for the amplifier 16, attacked at its gate by the signal that is present at the output of each controlled phase shifter 13 and 14. The emitters or sources of the transistors 151 and 161 are connected to an electrical ground of the generator 10 and the collectors or drains of the transistors 151 and 161 are connected on the one hand to the voltage Vcc by means of a stopping self-inductor, respectively 152 and 162 and furthermore to the outputs respectively 25 and 26 by means of a tuning self-inductor respectively 153 and 163.

The connections between the various phase-shifter elements 11 to 14 and amplifiers 15 and 16 may each comprise a linking capacitor respectively 21a for the link 21, 22a for the link 22, 23a for the link 23, 24a for the link 24, 25a for the link 25 and 26a for the link 26.

The invention claimed is:

1. A generator of a modulated radiofrequency signal, comprising:
   means for generating a first sinewave signal phase-shifted by a first variable value relative to a phase reference and a second sinewave signal phase-shifted by a given fixed nonzero value added to a second variable value relative to the phase reference, the second variable value being opposite to the first variable value relative to the phase reference, the first and the second variable values being representative of a modulation of the radiofrequency signal, the first and the second sinewave signals being of constant amplitude;
   a first fixed phase shifter configured to receive at its input the first and the second sinewave signals as pure sinewave signals, and configured to supply from a radiofrequency carrier with constant amplitude, a non-phase-shifted sinewave signal and a phase-shifted signal of the given fixed nonzero value;
   two amplifiers each amplifying one of the first and the second sinewave signals and operating at or close to respective saturation points; and
   a second fixed phase shifter with a value equal to the fixed nonzero value in order to the first and the second sinewave signals, the second fixed phase shifter coupling the first and the second sinewave signals originating from the two amplifiers in order to deliver the modulated radiofrequency signal.

2. The generator in according to claim 1, wherein the means for generating the first and the second sinewave signals comprise:
   a first controlled phase shifter phase-shifting the non-phase-shifted sinewave signal of the first variable value; and
   a second controlled phase shifter phase-shifting the phase-shifted sinewave signal of the second variable value; wherein the two amplifiers each amplify respective signals originating from one of the first and the second controlled phase shifters.

3. The generator according to claim 1, wherein the given fixed phase-shifting value is 90°.

4. The generator according to claim 1, further comprising means for turning off the two amplifiers.

5. A magnetic resonance imaging system comprising a generator according to claim 1.

6. A method for calibrating a generator, wherein the generator includes means for generating a first sinewave signal phase-shifted by a first variable value relative to a phase reference and a second sinewave signal phase-shifted by a given fixed nonzero value added to a second variable value relative to the phase reference, the second variable value being opposite to the first variable value relative to the phase reference, the first and the second variable values being representative of a modulation of the radiofrequency signal, the first and the second sinewave signals being of constant amplitude and being in pure sinewave form, two amplifiers each amplifying one of the first and the second sinewave signals and operating at or close to respective saturation points, and a fixed phase shifter with a value equal to the given nonzero fixed value to generate the first and the second sinewave signals, the fixed phase shifter coupling respective outputs originating from the two amplifiers in order to deliver a modulated radiofrequency signal, the method comprises:
   measuring an amplitude and a phase of the modulated radiofrequency signal using a probe;
   determining a coefficient for an amplitude for each of the pure first and second sinewave signals to determine if a rate of linearity of the modulated radiofrequency signal is less than a given tolerance; and
   determining a phase coefficient for a phase for each of the pure first and second sinewave signals to determine if the rate of linearity is less than the given tolerance.

7. The method of claim 6 further comprising:
correcting the amplitude and the phase of the pure first and the second sinewave signals in order to obtain the rate of linearity of the modulated radiofrequency signal to be within the given tolerance range.

* * * * *